US010393521B2

(12) United States Patent
Jiang et al.

(10) Patent No.: US 10,393,521 B2
(45) Date of Patent: Aug. 27, 2019

(54) LASER LINE GENERATING DEVICE (71) Applicant: STANLEY BLACK & DECKER INC., New Britain, CT (US)

(72) Inventors: Jia Yong Jiang, Suzhou (CN); Noreen M. O'Sullivan, Plainville, CT (US); Wang Shuang, Suzhou (CN)

(73) Assignee: Stanley Black & Decker Inc., New Britain, CT (US)

( * ) Notice: Subject to any disclaimer, the term of this patent is extended or adjusted under 35 U.S.C. 154(b) by 197 days.

(21) Appl. No.: 15/480,469

(22) Filed: Apr. 6, 2017

(65) Prior Publication Data
US 2018/0106616 A1    Apr. 19, 2018

(51) Int. Cl.
*G01C 15/00* (2006.01)
*H01S 5/042* (2006.01)
*H01S 5/00* (2006.01)
*H01S 5/062* (2006.01)
*H01S 5/40* (2006.01)

(52) U.S. Cl.
CPC .......... *G01C 15/004* (2013.01); *H01S 5/0071* (2013.01); *H01S 5/042* (2013.01); *H01S 5/06216* (2013.01); *H01S 5/005* (2013.01); *H01S 5/4025* (2013.01)

(58) Field of Classification Search
CPC .................................................. G01C 15/004
USPC .... 33/227, 1 CC, 1 DD, 276, 277, 281, 282, 33/283, 285, 286, 290, 291
See application file for complete search history.

(56) References Cited

U.S. PATENT DOCUMENTS

| 4,674,870 A | 6/1987 | Cain et al. |
| 4,732,471 A | 3/1988 | Cain et al. |
| 4,756,617 A | 7/1988 | Cain et al. |
| 5,610,647 A | 3/1997 | Takada |
| 5,834,750 A | 11/1998 | Coleman et al. |
| 6,183,129 B1 | 2/2001 | Aoyama et al. |
| 6,741,343 B2 | 5/2004 | Shafer et al. |
| 6,763,595 B1 * | 7/2004 | Hersey ................. G01C 15/004 33/286 |
| 6,941,665 B1 | 9/2005 | Budrow et al. |

(Continued)

FOREIGN PATENT DOCUMENTS

| BG | 539 Y1 | 5/2002 |
| CN | 2876710 | 3/2007 |

(Continued)

OTHER PUBLICATIONS

International Search Report dated Jun. 30, 2017, for Application No. PCT/CN2016/101949.

(Continued)

*Primary Examiner* — Christopher W Fulton
(74) *Attorney, Agent, or Firm* — Stephen R. Valancius (57) ABSTRACT

A laser beam generating device includes a housing a first laser diode which generates a visible first output beam which projects outside of the housing onto a surface and a second laser diode which generates a visible second output beam which projects outside of the housing onto the surface. The laser beam generating device has a first mode in which the first laser diode and the second laser diode are both on. In the first mode, the first laser diode is operated at a first duty cycle the second laser diode is operated at a second duty cycle. The first duty cycle and the second duty cycle are staggered.

15 Claims, 9 Drawing Sheets

(56) References Cited

U.S. PATENT DOCUMENTS

| | | | |
|---|---|---|---|
| 6,964,106 B2* | 11/2005 | Sergyeyenko | G01C 15/004 33/286 |
| 7,209,502 B2 | 4/2007 | Brosnan | |
| 7,252,411 B2* | 8/2007 | Busam | G01C 15/004 33/290 |
| 7,323,673 B1 | 1/2008 | Ake et al. | |
| 7,392,591 B2* | 7/2008 | Milligan | B25H 7/04 33/281 |
| 7,412,774 B2* | 8/2008 | Lu | G01C 15/004 33/286 |
| 7,454,839 B2* | 11/2008 | Della Bona | F16M 11/14 33/281 |
| 7,473,880 B2 | 1/2009 | Brosnan | |
| 7,483,153 B2 | 1/2009 | Yamazaki et al. | |
| 7,493,701 B2* | 2/2009 | Chen | G01C 15/004 33/286 |
| 7,589,829 B2 | 9/2009 | Yamazaki et al. | |
| 7,608,806 B2 | 10/2009 | Draper et al. | |
| 7,609,736 B2 | 10/2009 | Difazio et al. | |
| 7,730,624 B2* | 6/2010 | Nishimura | G01C 15/004 33/286 |
| 7,787,767 B2 | 8/2010 | Wang | |
| 7,982,861 B2 | 7/2011 | Abshire et al. | |
| 8,307,562 B2 | 11/2012 | Bascom et al. | |
| 8,640,350 B2 | 2/2014 | Bascom et al. | |
| 8,971,366 B2 | 3/2015 | Blasczak et al. | |
| 9,173,708 B2 | 11/2015 | Liu et al. | |
| 9,264,147 B2 | 2/2016 | Caplan et al. | |
| 9,303,990 B2 | 4/2016 | Bascom et al. | |
| 9,441,967 B2* | 9/2016 | Ranieri | G01C 15/004 |
| 2004/0170202 A1 | 9/2004 | Nishimura | |
| 2008/0072439 A1 | 3/2008 | Steffen et al. | |
| 2008/0078091 A1* | 4/2008 | McCracken | G01C 15/004 33/291 |
| 2011/0305256 A1 | 12/2011 | Chann et al. | |
| 2012/0090184 A1* | 4/2012 | Zimmermann | G01B 11/26 33/291 |
| 2013/0167386 A1* | 7/2013 | Peng | G01C 15/004 33/290 |
| 2013/0314688 A1* | 11/2013 | Likholyot | G01S 17/42 356/3.1 |
| 2014/0123508 A1 | 5/2014 | Graesser | |
| 2014/0202011 A1 | 7/2014 | Munroe et al. | |
| 2015/0000144 A1 | 1/2015 | Yuen et al. | |
| 2015/0109768 A1 | 4/2015 | Whitmore et al. | |
| 2015/0276401 A1 | 10/2015 | Graesser et al. | |
| 2016/0134377 A1 | 5/2016 | Caplan et al. | |

FOREIGN PATENT DOCUMENTS

| | | |
|---|---|---|
| DE | 4421073 C1 | 7/1995 |
| DE | 10361869 A1 | 7/2005 |
| JP | 6-186037 A2 | 7/1994 |
| JP | 7094815 | 4/1995 |
| JP | 7098224 | 4/1995 |
| JP | 0814899 | 1/1996 |
| JP | 3128365 | 1/2001 |
| JP | 2005083790 A | 3/2005 |
| JP | 2005331464 A | 12/2005 |
| JP | 2006214850 A | 8/2006 |

OTHER PUBLICATIONS

Believed General Background for Line Laser.
Believed Operation for Line Lasers.
Believed operation of prior art Hilti line lasers.
Pictures and believed operation of DeWalt lasers DW088K, DW089K and DW089LB.
Pictures and believed operation of Hilti PMC 46 Combination Laser.

* cited by examiner

LASER LINE GENERATING DEVICE

FIELD OF THE INVENTION

The present disclosure relates to an improved laser line generating device for assisting with construction layout tasks.

BACKGROUND

Laser line generators are commonly used for construction layout. For example, laser line generators may be used to partition an open space in a commercial building into useable office areas. In this example, the laser line generator generates squared lines on a floor which are in turn used to construct walls or cubicles. At some later time, it may be desirable to transfer the squared lines from the floor to the ceiling or from the ceiling to the floor. In other instances, it may be desirable to generate squared lines on the ceiling and floor simultaneously. In any case, it is desired to provide an improved laser line generator for assisting with construction layout tasks.

This section provides background information related to the present disclosure which is not necessarily prior art.

SUMMARY

According to an aspect, there is a laser beam generating device which includes a housing, a laser light generator disposed in the housing and operable to generate a first output beam and a second output beam, the first output beam and the second output beam projecting outside of the housing. The laser light generator is configured to operate in a first mode in which the first output beam is projected outside of the housing and the second output beam is not projected outside of the housing. The laser light generator is configured to operate in a second mode in which the first output beam and the second output beam are both projected outside of the housing. In the first mode, the first output beam is operated at a first duty cycle and in the second mode the first output beam is operated at a second duty cycle, different than the first duty cycle.

The first output beam may be projected as a line and wherein the second output beam is projected as a dot.

In the second mode at least a portion of the first output beam and the second output beam may overlap outside of the housing.

The first duty cycle may be higher than the second duty cycle.

The first duty cycle may be at least 10 percentage points higher than the second duty cycle.

The first duty cycle may be at least 15 percentage points higher than the second duty cycle.

The first duty cycle may be at least 20 percentage points higher than the second duty cycle.

The first duty cycle may be at least 25 percentage points higher than the second duty cycle.

The first duty cycle may be at least 30 percentage points higher than the second duty cycle.

The first duty cycle may be at least 35 percentage points higher than the second duty cycle.

The first duty cycle may be at least 40 percentage points higher than the second duty cycle.

The first duty cycle may be at least 45 percentage points higher than the second duty cycle.

The first duty cycle may be at least 50 percentage points higher than the second duty cycle.

The first duty cycle may be at least 55 percentage points higher than the second duty cycle.

The first duty cycle may be at least 60 percentage points higher than the second duty cycle.

The first duty cycle may be at least 65 percentage points higher than the second duty cycle.

The first duty cycle may be at least 70 percentage points higher than the second duty cycle.

The first duty cycle may be at least 75 percentage points higher than the second duty cycle.

The first duty cycle may be 85% or greater.

The second duty cycle may be 75% or less.

In the second mode, the first beam output and the second beam output may have staggered duty cycles whereby when a pulse of the first beam is high a pulse of the second beam is low and whereby when the pulse of the first beam is low, the pulse of the second beam is high.

The first output beam may be projected as a line and the second output beam may be projected as a dot.

In the second mode at least a portion of the first output beam and the second output beam may overlap outside of the housing.

The first duty cycle may be higher than the second duty cycle and the first duty cycle may be greater than 90%.

In the second mode, the second output beam may operate at a third duty cycle.

The second duty cycle may be less than 80%.

The third duty cycle may be less than 80%.

The laser light generator may include a first laser diode which generates the first output beam and a second laser diode which generates the second output beam.

According to another aspect, there is a laser light generating device including a housing; a first laser diode, the first laser diode operable to generate a visible first output beam which projects outside of the housing onto a surface; and a second laser diode, the second laser diode operable to generate a visible second output beam which projects outside of the housing onto the surface. The laser beam generating device is operable in a first mode wherein the first laser diode is on and a the second laser diode is off such that the visible first output beam is projected outside of the housing and a second mode in which the first laser diode and the second laser diode are both on such that both the visible first output beam and the visible second output beam are projected outside of the housing. In the first mode, the first laser diode is operated at a first duty cycle and in the second mode the first laser diode is operated at a second duty cycle, different than the first duty cycle.

The first duty cycle may be higher than the second duty cycle.

The first duty cycle may be at least 15 percentage points higher than the second duty cycle.

The first duty cycle may be at least 25 percentage points higher than the second duty cycle.

The first visible output beam may produce a line and wherein the second visible output beam produces a dot.

The dot may intersect with the line.

The first visible output beam and the second visible output beam may intersect.

In the second mode, the second laser diode is operated at a third duty cycle. The second duty cycle and the third duty cycle are staggered.

In the second mode, the second laser diode may be operated at a third duty cycle, wherein the second duty cycle and the third duty cycle have the same phase.

The laser beam generating device may further include a third mode in which the first laser diode and the second laser diode are both on such that both the visible first output beam and the visible second output beam are projected outside of the housing. The first laser diode may be operated at a first frequency in the second mode. The first laser diode may be operated in a second frequency in the third mode and the second frequency may be at least 20% different than the first frequency.

According to another aspect, there is a laser beam generating device including a housing; a first laser diode, the first laser diode operable to generate a visible first output beam which projects outside of the housing onto a surface; a second laser diode, the second laser diode operable to generate a visible second output beam which projects outside of the housing onto the surface. The laser beam generating device is operable in a first mode in which the first laser diode and the second laser diode are both on such that both the visible first output beam and the visible second output beam are projected outside of the housing. In the first mode, the first laser diode is operated at a first duty cycle the second laser diode is operated at a second duty cycle and wherein the first duty cycle and the second duty cycle are staggered.

High states of the first duty cycle and the second duty cycle may overlap less than 25% of the time.

The high states of the first duty cycle and the second duty cycle may overlap less than 15% of the time.

According to another aspect, there is an exemplary embodiment of a laser beam generating device which includes a housing, a first laser diode, the first laser diode operable to generate a visible first output beam which projects outside of the housing onto a surface and a second laser diode, the second laser diode operable to generate a visible second output beam which projects outside of the housing onto the surface. The laser beam generating device has a first mode in which the first laser diode is on and the second laser diode is off such that the visible first output beam is projected outside of the housing and the visible second output beam is not projected outside of the housing. The laser beam generating device has second and third modes in which both the first laser diode and the second laser diode are on such that the visible first output beam is projected outside of the housing and the visible second output beam is projected outside of the housing. The first laser diode may be operated at a first frequency in the second mode. The first laser diode may be operated at a second frequency in the third mode, the second frequency being different than the first frequency.

The second frequency may be at least 15% different (at least 15% higher or at least 15% lower) than the first frequency.

The second frequency may be at least 30% different (at least 30% higher or at least 30% lower) than the first frequency.

The second frequency may be at least 50% different (at least 50% higher or at least 50% lower) than the first frequency.

The second frequency may be at least 75% different (at least 75% higher or at least 75% lower) than the first frequency.

According to another aspect, there is an exemplary embodiment of a laser beam generating device which includes a housing, a first laser diode, the first laser diode operable to generate a visible first output beam which projects outside of the housing onto a surface and a second laser diode, the second laser diode operable to generate a visible second output beam which projects outside of the housing onto the surface. At least one of the average or instantaneous power output of at least one of the beams is adjusted such that a predetermined maximum average or instantaneous (respectively) combined power output of the (at least two) beams is not exceeded.

The predetermined maximum average intensity may be 2 $W/cm^2$. The predetermined maximum average intensity may be 2 $W/cm^2$ and measured over 2 seconds. The predetermined maximum average intensity may be 2 $W/cm^2$ and measured over 5 seconds.

The predetermined maximum average intensity may be 2.5 $W/cm^2$. The predetermined maximum average intensity may be 2.5 $W/cm^2$ and measured over 2 seconds. The predetermined maximum average intensity may be 2.5 $W/cm^2$ and measured over 5 seconds.

The predetermined maximum average intensity may be 3 $W/cm^2$. The predetermined maximum average intensity may be 3 $W/cm^2$ and measured over 2 seconds. The predetermined maximum average intensity may be 3 $W/cm^2$ and measured over 5 seconds.

The predetermined maximum average intensity may be 3.5 $W/cm^2$. The predetermined maximum average intensity may be 3.5 $W/cm^2$ and measured over 2 seconds. The predetermined maximum average intensity may be 3.5 $W/cm^2$ and measured over 5 seconds.

The predetermined maximum average intensity may be 4 $W/cm^2$. The predetermined maximum average intensity may be 4 $W/cm^2$ and measured over 2 seconds. The predetermined maximum average intensity may be 4 $W/cm^2$ and measured over 5 seconds.

The predetermined maximum instantaneous intensity may be 2 $W/cm^2$. The predetermined maximum instantaneous intensity may be 2.5 $W/cm^2$. The predetermined maximum instantaneous intensity may be 3 $W/cm^2$. The predetermined maximum instantaneous intensity may be 3.5 $W/cm^2$. The predetermined maximum instantaneous intensity may be 4 $W/cm^2$.

The average power output may be adjusted by varying the duty cycle of at least one modulated beam.

The instantaneous power output may be adjusted by (at least) two beams being modulated out of phase with respect to each other.

The instantaneous power output may be adjusted by there being (at least) two constant (unmodulated) beams, at least one of which is emitted at reduced power.

According to another aspect, there is an exemplary embodiment of a laser beam generating device which includes a housing, a first laser diode, the first laser diode operable to generate a visible first output beam which projects outside of the housing onto a surface and a second laser diode, the second laser diode operable to generate a visible second output beam which projects outside of the housing onto the surface. The first and second visible output beams overlap one another. The first laser diode and the second laser diode may be independently turned on and off. The laser generating device may automatically adjust the output of at least one of the first laser diode and the second laser diode when they are both turned on at the same time so as to limit the intensity of the laser beams at the overlap.

DETAILED DESCRIPTION OF EXEMPLARY EMBODIMENTS

Figure 1:
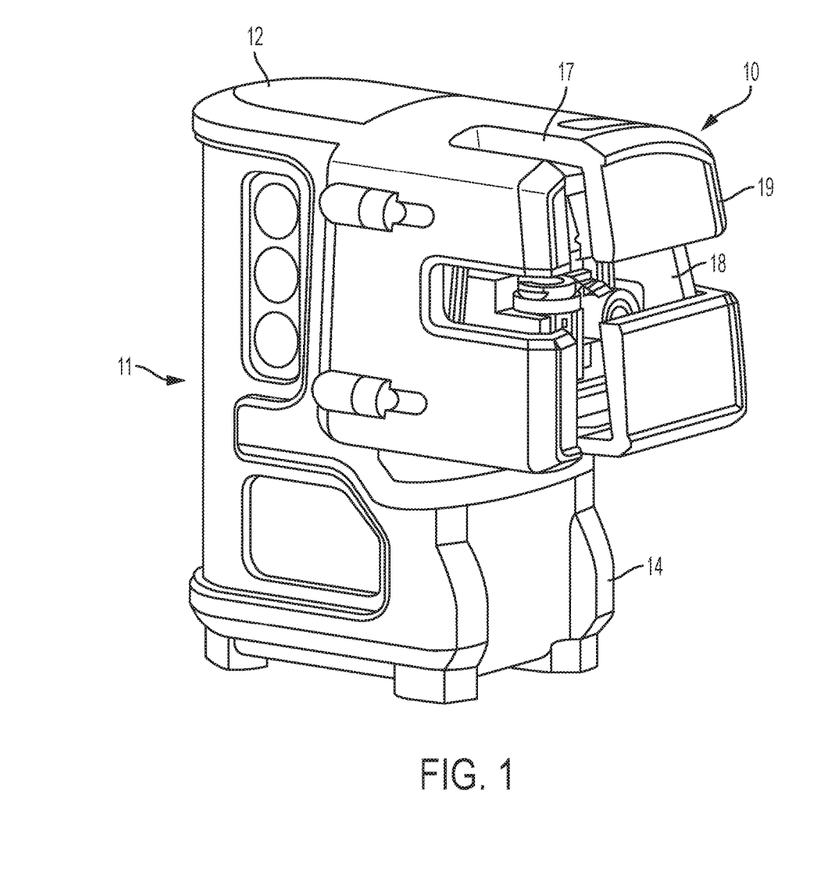
FIG. 1 is a perspective view of an exemplary embodiment of a laser beam generating device.
Figure 2:
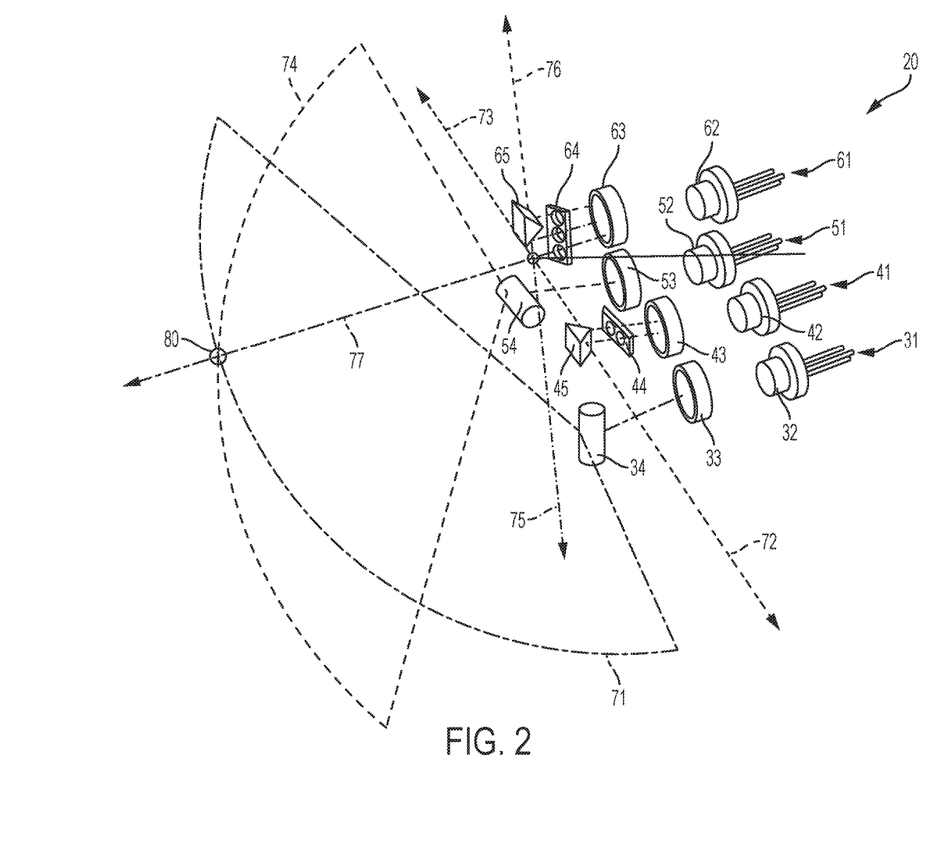
FIG. 2 is an exploded view of laser modules for the exemplary embodiment of the laser beam generating device.
Figure 3:
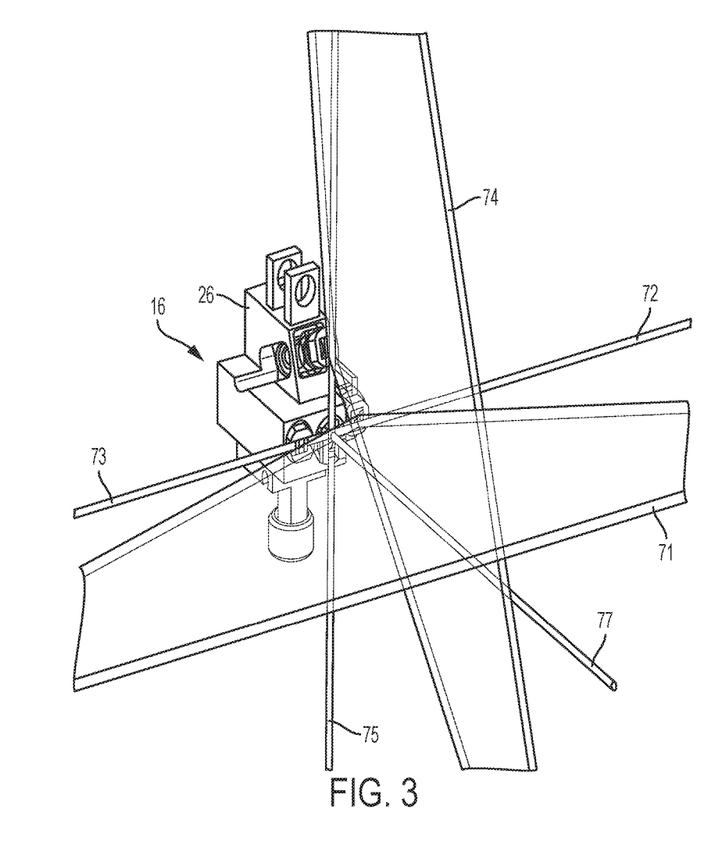
FIG. 3 is a perspective view of a laser assembly of the exemplary embodiment of the laser beam generating device.

FIGS. 1-3 illustrate an exemplary laser line generating device 10. The laser line generating device 10 includes a housing 11. The housing 11 includes an upper housing 12 and a lower housing 14 which mate together. The housing also further includes a roll cage 19 and the housings 12, 14 and roll cage 19 form a cavity. The roll cage 19 includes an opening 17 through which laser beams can project. The opening is covered by a transparent member 18, such as a transparent glass or plastic. The opening 17 may be one continuous opening or may have multiple separate parts.

A laser assembly 16, shown in FIG. 3, is disposed in the cavity formed by the upper and lower housings 12, 14 and the roll cage 19. In an exemplary embodiment, the upper and lower housings 12, 14 are formed by injection molding using a suitable plastic material although other materials are contemplated by this disclosure. The roll cage of the exemplary embodiment is formed of metal, but may also be formed of other materials such as a hard plastic.

As shown in FIG. 3, the laser assembly includes a gimbal assembly 26. The gimbal assembly 26 holds a number of laser modules 20 (FIG. 2). Additionally, the gimbal assembly 26 is rotatable by gravity so that it levels the laser modules 20 so that they provide horizontal and vertical lines and dots. The gimbal assembly 26 may either be allowed to rotate to a level position so that it provides level horizontal and vertical lines or the gimbal assembly 26 may be locked in place so that it does not rotate. The laser modules 20 are operable to emit planes or dots of light through the transparent member 18.

The laser modules 20 are shown in an exploded view without the gimbal assembly 26 in FIG. 2. As shown in FIG. 2, there are four laser modules 31, 41, 51 and 61. Laser module 31 includes a laser diode 32, a collimating lens 33 and a cylindrical lens 34. The laser module 31 outputs a horizontal line 71. The laser diode 32 outputs a laser beam. The collimating lens 33 collimates the beam and the cylindrical lens 34 converts the beam to the line output 71. The line 71 is a horizontal line when the laser generating device 10 is placed on a flat surface and the gimbal assembly 26 reaches its level position.

Laser module 41 includes a laser diode 42, a collimating lens 43, a mask 44 and a beam splitter 45. The mask 44 provides two beams from the laser diode 42 by allowing only part of the collimated beam to pass through. The beam splitter 45 directs the two beams in opposite directions through the use of a mirrored surface to produce a dot producing beam 72 on one side and a dot producing beam 73 opposite the beam 72. This will create dots on opposite surfaces (i.e., left and right sides when the laser line generating device 10 is placed on a flat surface and the gimbal assembly 26 is free to move to a leveled position).

Laser module 51 includes a laser diode 52, a collimating lens 53 and a cylindrical lens 54. The laser module 51 outputs a vertical line 74. Laser module 61 includes a laser diode 62, a collimating lens 63, a mask 64 and a beam splitter 65. The mask 64 provides three beams from the laser diode 62 and the beam splitter 65 splits the beams to produce a downward projecting dot producing beam 75, an upward projecting dot producing beam 76 opposite the beam 75 and a forward projecting dot producing beam 77. This will create dots on opposite surfaces, such as a floor and a ceiling as well as a dot forward of the laser generating device 10.

Figure 4:
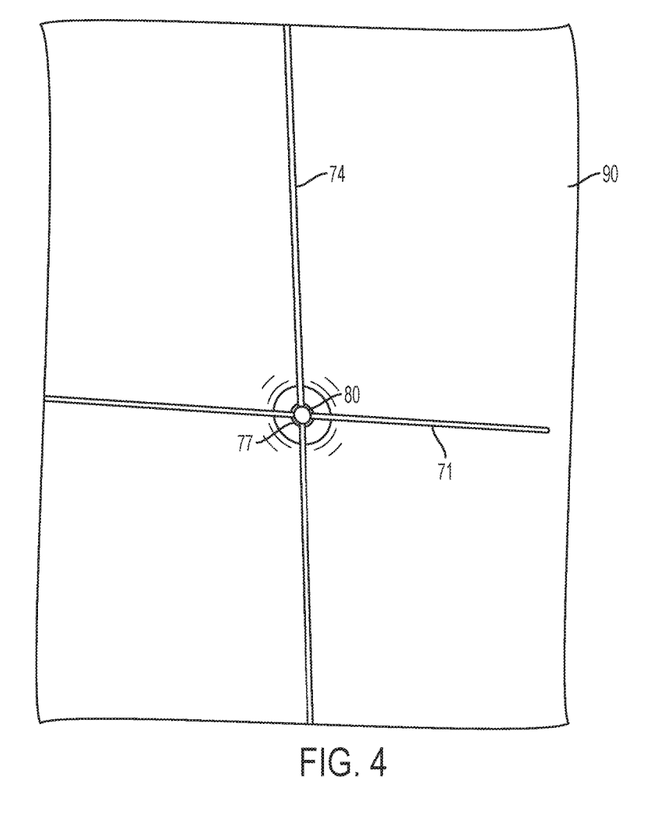
FIG. 4 is a view of a wall with intersecting laser beam lines and a laser beam dot.

As will be appreciated, the beams 71, 74 and 77 will all intersect at a point 80. Accordingly, the intensity of the three beams 71, 74 and 77 will be additive at that point 80. That is, the intensity of the beams at 80 will be greater than the intensity of any of the beams 71, 74 and 77 alone. This is shown in FIG. 4. As shown in FIG. 4, the intersection of the beams 71, 74 and 77 produce an intensified beam at spot 80 on a wall 90.

In the laser line generating device 10 of the exemplary embodiment, the individual laser diodes 32, 42, 52 and 62 can be turned on and off independently. For example, only the laser diode 32 can be turned on and the device 10 will produce only a horizontal line 71. At another time, the diode 32 and the diode 52 can be turned on and the diodes 42 and 62 can remain off. In that instance, the laser line generating device 10 will output horizontal line 71 and vertical line 74. Any combination of the laser diodes may be turned on at any particular time including any single diode or any combination of diodes.

When one of the laser diodes 20 are turned on, the diode is powered by pulse width modulation (PWM). With PWM, the diode is powered over a certain percentage of a cycle, called a duty cycle. If the diode is powered continuously, the duty cycle is 100%. If the diode is powered half of the time, the duty cycle is 50%. The powered state of the duty cycle can also be referred to as the high or on state and the unpowered portion of the duty cycle can be referred to the low or off state. The greater the duty cycle, the greater the intensity of the beam output from the laser diodes 20.

Figure 5:
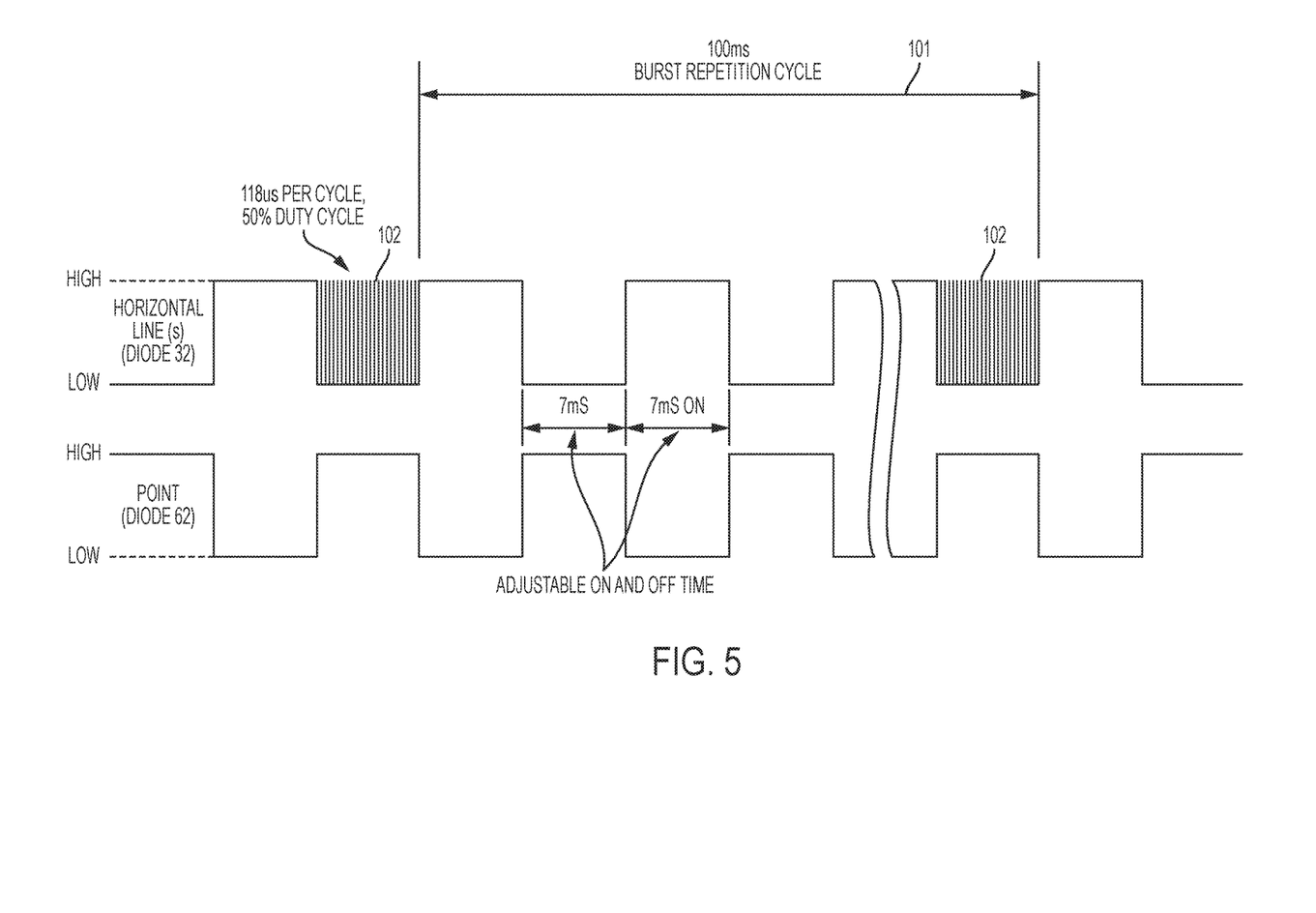
FIG. 5 is a diagram of pulse-width-modulation (PWM) duty cycles for diodes of the exemplary embodiment of the laser beam generating device.
Figure 6:
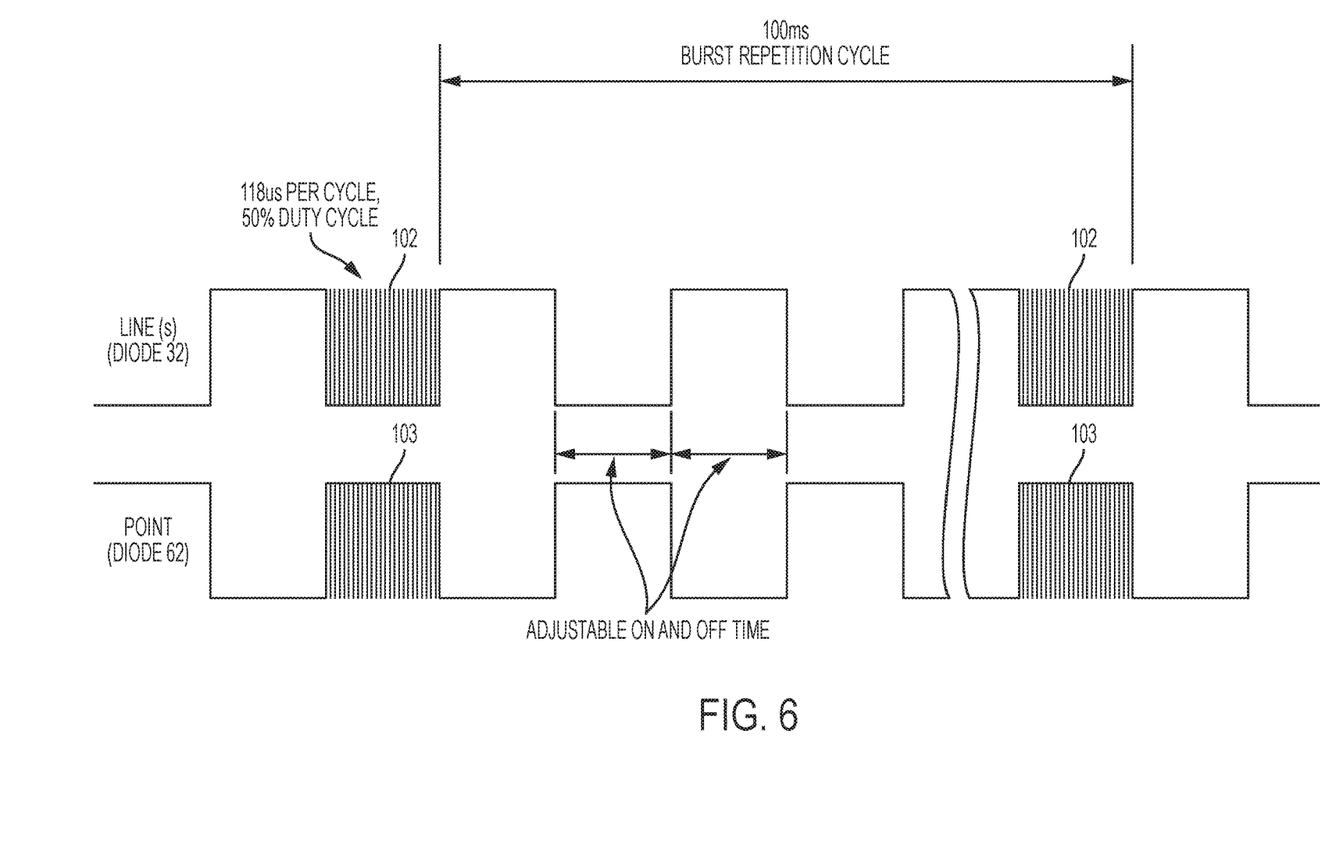
FIG. 6 is another diagram of pulse-width-modulation (PWM) duty cycles for diodes of the exemplary embodiment of the laser beam generating device.

In the exemplary embodiment of the laser line generating device 10, the laser diodes 20 may be run at different duty cycles when they are used together than when they are used separately. A user may want to have a duty cycle as high as possible so that the intensity of the output beams is as high as possible. On the other hand, the combined intensity of multiple output beams may create too high of an intensity. Accordingly, according to an exemplary embodiment, the duty cycles of the laser diodes may change depending upon which of the diodes 20 are operating. In a first mode when the diode 32 is turned on to produce horizontal line 71 and the diode 62 is not turned on, the diode 32 may be run at a duty cycle close to 100%. The duty cycle may be, for example, 95% or greater, 90% or greater or 85% or greater. In a second mode, when both the diode 32 and the diode 62 are turned on to produce visible beams, the diodes 32 and 62 may each be run at a duty cycle of 50%, as is shown in FIGS. 5 and 6. When the duty cycle of the diode 62 is 100% in the first mode and 50% in the second mode, it is 50 percentage points higher in the first mode than in the second mode. In other embodiments, the duty cycle may be 10 or more percentage points greater in the first mode than the second mode; 20 or more percentage points greater in the first mode than the second mode; 30 or more percentage points greater in the first mode than the second mode; 40 or more percentage points greater in the first mode than the second mode; or 50 or more percentage points greater in the first mode than the second mode.

The duty cycles are run staggered such that when the diode 32 is powered (high) the diode 62 is unpowered (low) and when the diode 32 is unpowered (low) the diode 62 is powered (high). In this manner, the intensity of the laser output from the laser line generating device 10 does not get too great at the overlapping point 80. In some embodiments, the staggered duty cycles may overlap to some extent such that both the diode 32 and the diode 62 are high at the same time or low at the same time for a brief amount of time. The amount of overlap may be less than 25% of the time or less than 15% of the time.

In this manner, the combined intensity of the laser beams (77 and 74 and/or 71) at point 80 can remain at the same intensity as the intensity of the dot laser beam 77 by itself. In some examples, the combined intensity may be slightly greater. Particularly, the combined intensity of the laser beams at the intersection 80 may be 110% or less of the intensity of the laser beam 77 run alone; 120% or less of the intensity of the laser beam 77 run alone; 130% or less of the intensity of the laser beam 77 run alone; or 140% or less of the intensity of the laser beam 77 run alone.

FIGS. 5 and 6 illustrate the PWM of the diodes 32 and 62 when they are both turned on (i.e., the second mode, discussed above). As shown in FIGS. 5 and 6, the diode 32 and the diode 62 are each operated at a duty cycle of 50% so that the diode is at a high state 50% of the time. The duty cycles are staggered such that when the diode 32 is at a high state, the diode 62 is at a low state.

Various particular operating schemes involving changed duty cycles depending upon the diodes being operated (i.e., different operating modes) are possible. Additionally, the various operating schemes may include different particular duty cycles. Several examples of operating schemes including various modes are shown below. Each row of the examples is considered to be one mode of the example operating scheme.

Example 1

| Laser Line Generating Device 10 Visibly Projected Beams | Diode 32 Duty Cycle | Diode 52 Duty Cycle | Diode 62 Duty Cycle |
|---|---|---|---|
| Line 71 projected; Line 74 not projected; Dots 75, 76, 77 - not projected | 100% OR Greater than 90% OR Greater than 80% | 0% | 0% |
| Line 71 not projected; Line 74 projected; Dots 75, 76, 77 - not projected | 0% | 100% OR Greater than 90% OR Greater than 80% | 0% |
| Line 71 not projected; Line 74 not projected; Dots 75, 76, 77 - projected | 0% | 0% | 100% OR Greater than 90% OR Greater than 80% |
| Line 71 projected; Line 74 projected; Dots 75, 76, 77 - not projected | 100% OR Greater than 90% OR Greater than 80% | 100% OR Greater than 90% OR Greater than 80% | 0% |
| Line 71 projected; Line 74 projected; Dots 75, 76, 77 - projected | 50% | 50% | 50% |
| Line 71 projected; Line 74 not projected; Dots 75, 76, 77 - projected | 50% | 0% | 50% |
| Line 71 not projected; Line 74 projected; Dots 75, 76, 77 - projected | 0% | 50% | 50% |

Example 2

| Laser Line Generating Device 10 Visibly Projected Beams | Diode 32 Duty Cycle | Diode 52 Duty Cycle | Diode 62 Duty Cycle |
|---|---|---|---|
| Line 71 projected; Line 74 not projected; Dots 75, 76, 77 - not projected | 100% OR Greater than 90% OR Greater than 80% | 0% | 0% |
| Line 71 not projected; Line 74 projected; Dots 75, 76, 77 - not projected | 0% | 100% OR Greater than 90% OR Greater than 80% | 0% |

-continued

| Laser Line Generating Device 10 Visibly Projected Beams | Diode 32 Duty Cycle | Diode 52 Duty Cycle | Diode 62 Duty Cycle |
|---|---|---|---|
| Line 71 not projected; Line 74 not projected; Dots 75, 76, 77 - projected | 0% | 0% | 100% OR Greater than 90% OR Greater than 80% |
| Line 71 projected; Line 74 projected; Dots 75, 76, 77 - not projected | 50% | 50% | 0% |
| Line 71 projected; Line 74 projected; Dots 75, 76, 77 - projected | 33% | 33% | 33% |
| Line 71 projected; Line 74 not projected; Dots 75, 76, 77 - projected | 50% | 0% | 50% |
| Line 71 not projected; Line 74 projected; Dots 75, 76, 77 - projected | 0% | 50% | 50% |

Example 3

| Laser Line Generating Device 10 Visibly Projected Beams | Diode 32 Duty Cycle | Diode 52 Duty Cycle | Diode 62 Duty Cycle |
|---|---|---|---|
| Line 71 projected; Line 74 not projected; Dots 75, 76, 77 - not projected | 100% OR Greater than 90% OR Greater than 80% | 0% | 0% |
| Line 71 not projected; Line 74 projected; Dots 75, 76, 77 - not projected | 0% | 100% OR Greater than 90% OR Greater than 80% | 0% |
| Line 71 not projected; Line 74 not projected; Dots 75, 76, 77 - projected | 0% | 0% | 100% OR Greater than 90% OR Greater than 80% |
| Line 71 projected; Line 74 projected; Dots 75, 76, 77 - not projected | 75% | 75% | 0% |
| Line 71 projected; Line 74 projected; Dots 75, 76, 77 - projected | 50% | 50% | 30% |
| Line 71 projected; Line 74 not projected; Dots 75, 76, 77 - projected | 75% | 0% | 50% |
| Line 71 not projected; Line 74 projected; Dots 75, 76, 77 - projected | 0% | 75% | 50% |

The different modes (row) of the different examples may be interchanged or added to the different examples. For example, the mode of the last row of Example 3 could replace the last row of Example 2 or could be added as an additional mode (row) to Example 3. Also, other duty cycles are possible. For example, the duty cycle for diode 52 in the last mode (row) of Example 3 could be 80% or 70% instead of 75%.

FIGS. 5 and 6 also illustrate a burst repetition cycle 101. The burst repetition cycle 101 is an additional feature which may be added to the above examples. The burst repetition cycle 101 is a 100 ms cycles and includes one pulse cycle 102. In the pulse cycle, the diode 32 is operated at a 50% duty cycle at a high speed during one of period where the diode 32 would otherwise be operated at a low. The burst repetition cycle may be used to help detect the horizontal laser line 71. In FIG. 5, only the diode 32 has a pulse cycle 102.

As shown in FIG. 6, the diode 62 may also have a pulse cycle 103. The pulse cycle 103 also allows for detection of the dots 75, 76 and 77. The pulse cycle 103 is similar to pulse cycle 102 in that it is operated at a 50% duty cycle. However, the pulse cycle 103 operates at a time where the diode 62 would otherwise be at a low, as is shown in FIG.

6. In the embodiment of FIG. 6, the pulse cycles 102 and 103 can themselves be staggered such that the diode 32 and the diode 62 are high at opposite times. Although diodes 32 and 62 are illustrated in FIGS. 5 and 6, the pulse cycles may be applied to other diodes. For example, diode 52 could similarly include a pulse cycle 102.

Figure 7:
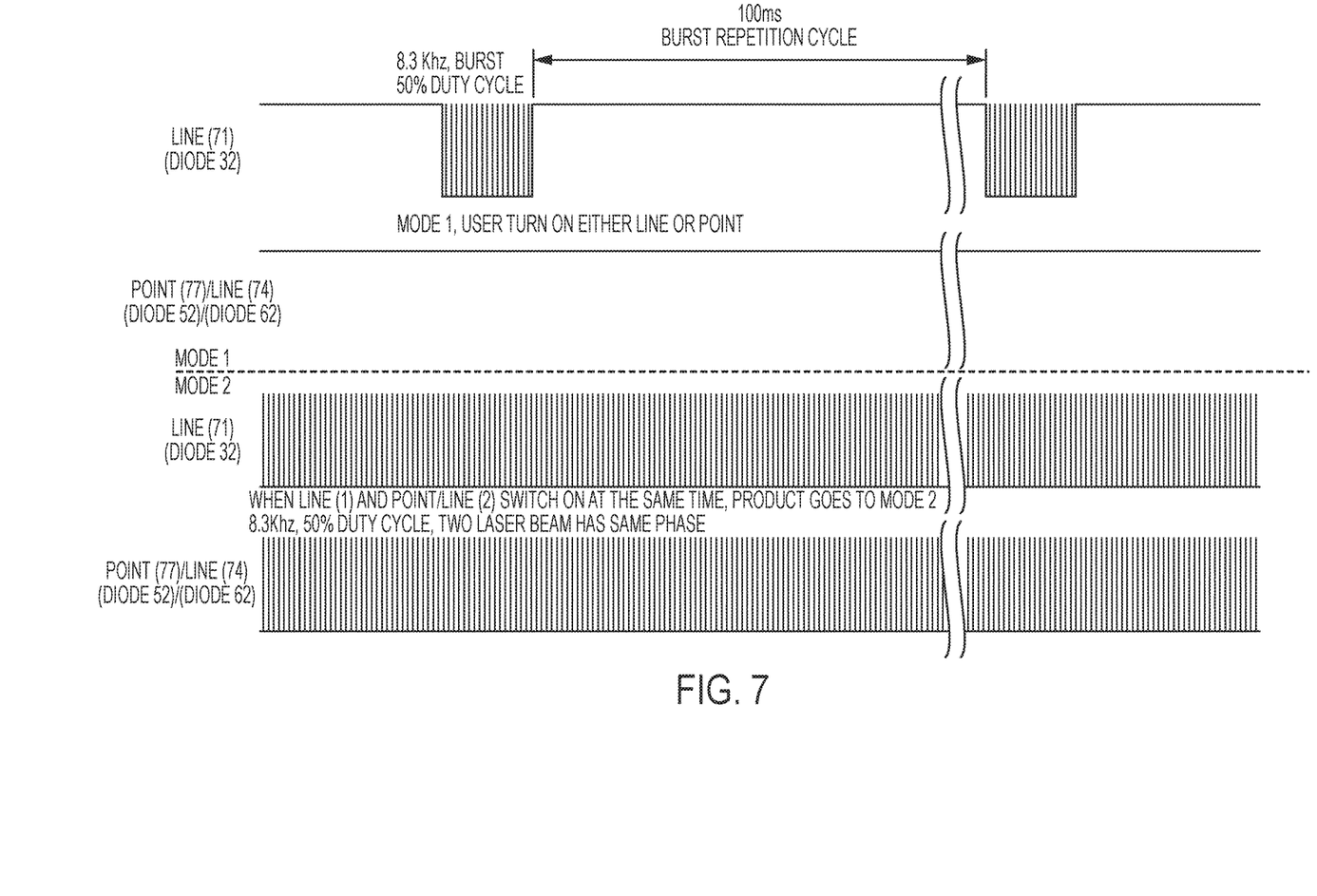
FIG. 7 is a diagram of another exemplary embodiment of pulse-width-modulation (PWM) duty cycles for diodes of the laser beam generating device.

Another exemplary embodiment of different modes is shown in FIG. 7. As shown in FIG. 7, when only a diode 32 is turned on creating a first line 71, the diode 32 is run at a 100% duty cycle. Bursts 102 may also include for the diode 32 to aid in detection of the line 71 by a laser detector. Similarly, when either the diode 52 is run by itself or diode 62 is run by itself, those diodes are run at a 100% duty cycle, as shown in the top half of FIG. 7 (Mode 1). Mode 1 of FIG. 7 is shown in the top half of the drawing and includes the situations where one of the diodes 32, 52 or 62 are run without the other two. In FIG. 7, the diode 32 is shown as being run with bursts 102 and the diodes 52 and 62 without bursts. However, any of the diodes may be run with or without the bursts 102.

Mode 2 of the exemplary embodiment of FIG. 7 is shown at the bottom half of the drawing. Mode 2 is automatically entered when two or more of the diodes 32, 52 and 62 are turned on at the same time. As shown, in Mode 2, the diodes are each operated at a 50% duty cycle. In the exemplary embodiment, the diodes are operated at the same phase, rather than staggered. In other exemplary embodiments, the duty cycles may be staggered. In the exemplary embodiment, when the diode 32 is operated to project beam 71 at the same time that either one or both of the diodes 52 and 62 are turned on to project the beam 74 and dot 77, the diodes which are turned on are operated at a 50% duty cycle at a frequency of 8.3 kilohertz (kHz). Other duty cycles are also possible. For example, the duty cycle may be in the range of 40-60%; 35-65% or 30-70%. Additionally, the frequency does not have to be 8.3 kHz. The frequency may be in a range of 7-9 kHz; 6.5-9.5 kHz; 6-10 kHz or 5-11 kHz.

Figure 8:
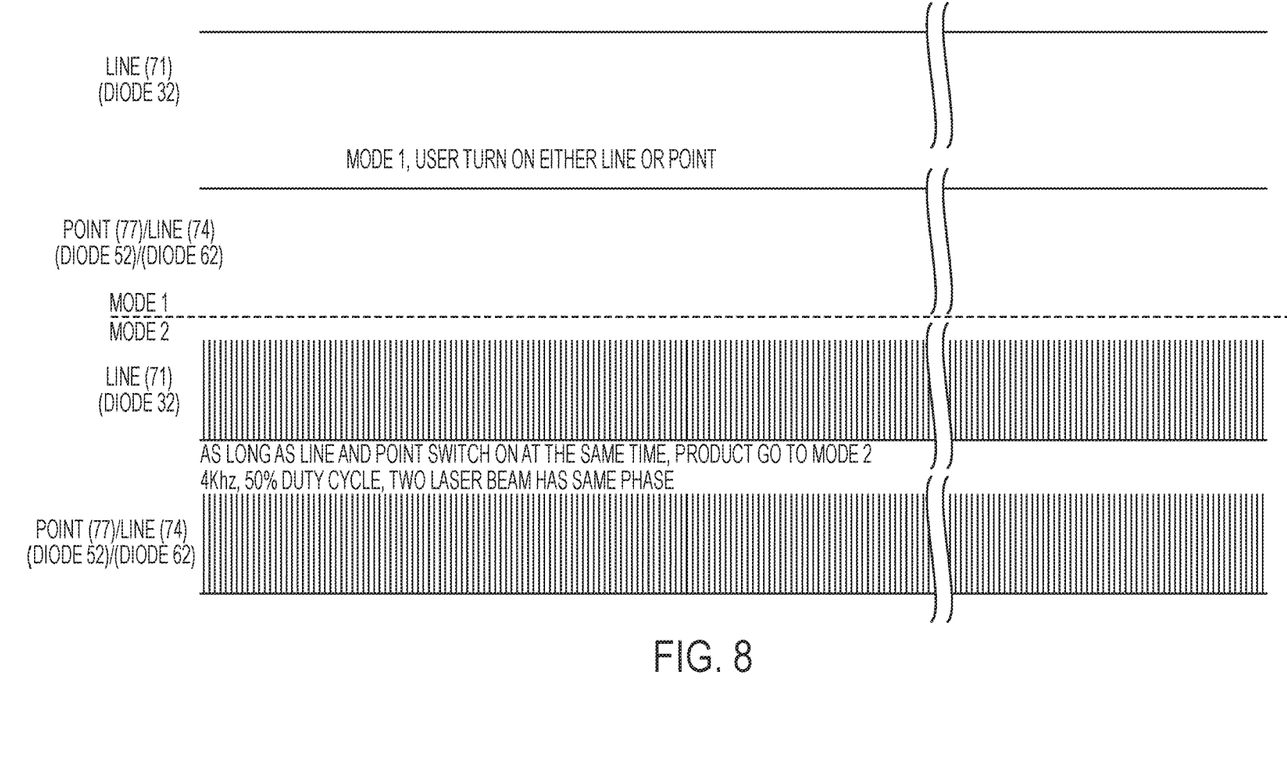
FIG. 8 is a diagram of yet another exemplary embodiment of pulse-width-modulation (PWM) duty cycles for diodes of the laser beam generating device.
Figure 9:
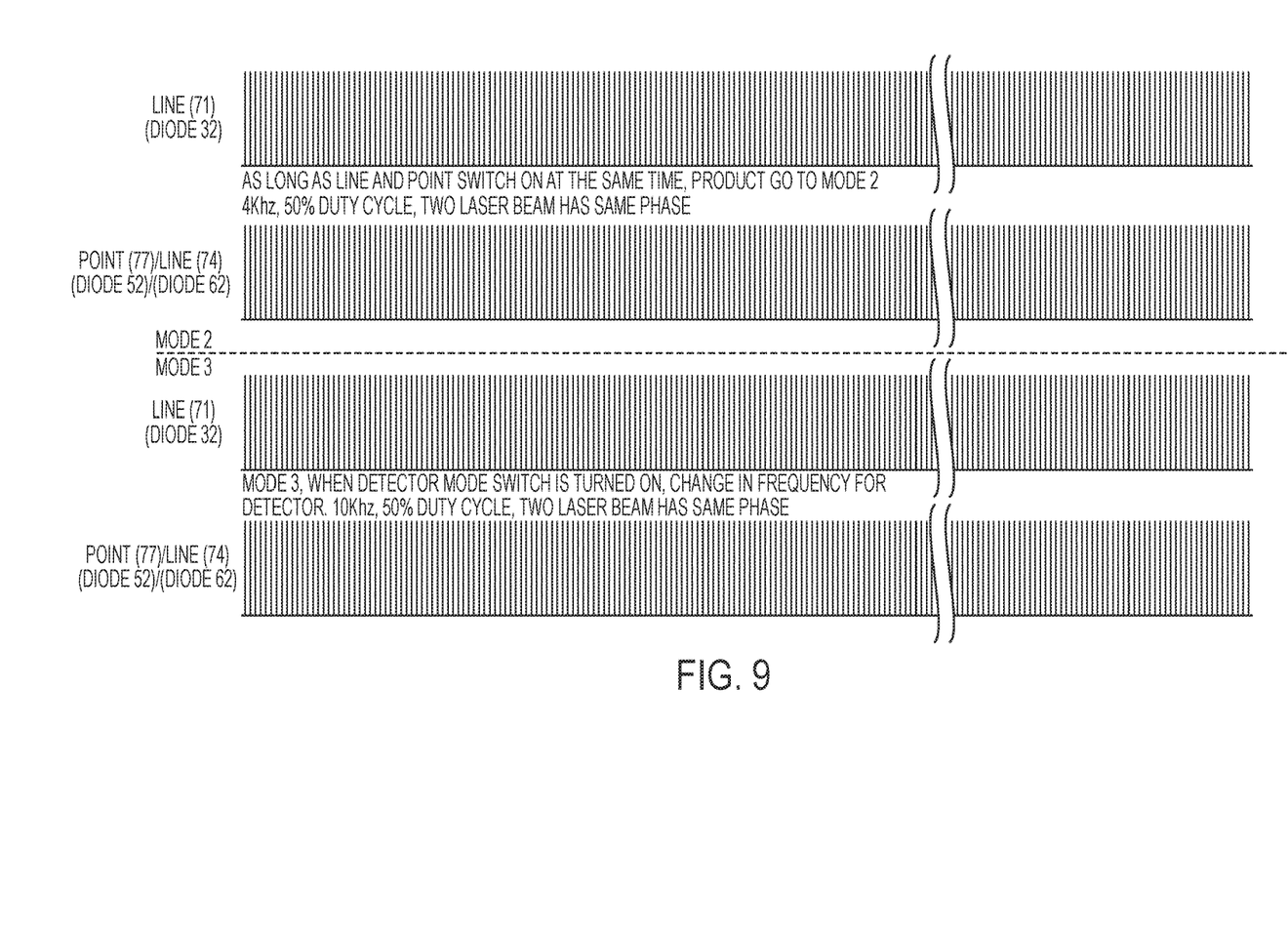
FIG. 9 is another diagram of the exemplary embodiment of FIG. 8 of pulse-width-modulation (PWM) duty cycles for diodes of the laser beam generating device.

Another exemplary embodiment is shown in FIGS. 8 and 9 in which the frequency of the duty cycles change. FIGS. 8 and 9 show three (3) different modes. FIG. 8 illustrates a Mode 1 at the top half of the drawing and a Mode 2 at the bottom half of the drawing. FIG. 9 illustrates Mode 2 at the top half of the drawing and Mode 3 at the bottom half of the drawing. Mode 1 of FIG. 8 is similar to Mode 1 of the exemplary embodiment of FIG. 7. Specifically, Mode 1 includes diodes operating at a 100% duty cycle. The diode 32 is operated at a 100% duty cycle to project a line 71 when the diode 32 is on and the diodes 52 and 62 and their respective line 74 and dots 75, 76, 77 are off. The diode 52 is operated at a 100% duty cycle to project a line 74 when the diode 52 is on and the diodes 32 and 62 and their respective line 71 and dots 75, 76, 77 are off. Similarly, the diode 62 is operated at a 100% duty cycle to project dots 75, 76 and 77 when the diode 62 is on and the diodes 32 and 52 and their respective line 71 and 74 are off. Mode 1 of the exemplary embodiment of FIGS. 8 and 9 does not include any burst, though such a feature may be included in other exemplary embodiments.

Mode 2 of the exemplary embodiment of FIGS. 8 and 9 is shown at the bottom of FIG. 8 and again at the top of FIG. 9. In mode 2, more than one of the diodes 32, 52 and 62 are operated at the same time so that multiple lines or at least one line and a dot are projected such that they intersect at 80. In mode 2, the operating diodes are operated at a 50% duty cycle at the same phase and at a frequency of 4 kilohertz (kHz). As will be appreciated, this is a lower frequency than that of the embodiment of FIG. 7. In other embodiments, other frequencies are also possible. For example, the frequency may be in a range of 3-5 kHz; 2.5-5.5 kHz; 2-6 kHz or 1.5-6.5 kHz.

Mode 3 is shown at the bottom half of FIG. 9. Mode 3 is similar to Mode 2 in that the diodes are operated at a 50% duty cycle. However, in Mode 3, the frequency of the duty cycle is 10 kilohertz (kHz). That is, the frequency in Mode 3 is different than the frequency in Mode 2. Accordingly, the frequency in mode 3 is more than double the frequency in mode 2. In various embodiments, the frequency may of mode 3 may be 50% or more higher than the frequency of mode 2; 75% or more higher than the frequency of mode 2; 100% or more higher than the frequency of mode 2; or 125% or more higher than the frequency of mode 2. Additionally, the frequency of Mode 3 in different embodiments may be different than 10 kilohertz (kHz). For example, the frequency may be in a range of 9-11 kHz; 8.5-11.5 kHz; 8-12 kHz or 7-13 kHz. The change in frequency between Modes 2 and 3 allows for the lasers to be detected by a detector. The detector may detect a change in frequency which allows the lasers to be more easily detected.

As can be appreciated, according to exemplary embodiments of the present application, the intensity of the combined laser beams at point 80 does not become too high. When more than one laser beam is on such that they would overlap at point 80, the power of one or more of the diodes can be adjusted to prevent the intensity at point 80 from exceeding a predetermined maximum intensity. The predetermined maximum intensity may be an instantaneous maximum intensity or an average maximum predetermined intensity measured over a short period of time. For example, the predetermined maximum average intensity may be 2 $W/cm^2$. The predetermined maximum average intensity may be 2 $W/cm^2$ and measured over 2 seconds. The predetermined maximum average intensity may be 2 $W/cm^2$ and measured over 5 seconds.

The predetermined maximum average intensity may be 2.5 $W/cm^2$. The predetermined maximum average intensity may be 2.5 $W/cm^2$ and measured over 2 seconds. The predetermined maximum average intensity may be 2.5 $W/cm^2$ and measured over 5 seconds.

The predetermined maximum average intensity may be 3 $W/cm^2$. The predetermined maximum average intensity may be 3 $W/cm^2$ and measured over 2 seconds. The predetermined maximum average intensity may be 3 $W/cm^2$ and measured over 5 seconds.

The predetermined maximum average intensity may be 3.5 $W/cm^2$. The predetermined maximum average intensity may be 3.5 $W/cm^2$ and measured over 2 seconds. The predetermined maximum average intensity may be 3.5 $W/cm^2$ and measured over 5 seconds.

The predetermined maximum average intensity may be 4 $W/cm^2$. The predetermined maximum average intensity may be 4 $W/cm^2$ and measured over 2 seconds. The predetermined maximum average intensity may be 4 $W/cm^2$ and measured over 5 seconds.

The predetermined maximum instantaneous intensity may be 2 $W/cm^2$. The predetermined maximum instantaneous intensity may be 2.5 $W/cm^2$. The predetermined maximum instantaneous intensity may be 3 $W/cm^2$. The predetermined maximum instantaneous intensity may be 3.5 $W/cm^2$. The predetermined maximum instantaneous intensity may be 4 $W/cm^2$.

While the invention has been described by way of exemplary embodiments, it is understood that the words which have been used herein are words of description, rather than words of limitation. Additionally, it is understood that various features of the different embodiments may be combined. Changes may be made within the purview of the appended claims, without departing from the scope and spirit of the invention in its broader aspects.

What is claimed is:

1. A laser beam generating device, comprising:
a housing;
a laser light generator disposed in the housing and operable to generate a first output beam and a second output beam, the first output beam and the second output beam projecting outside of the housing;
wherein the laser light generator is configured to operate in a first mode in which the first output beam is projected outside of the housing and the second output beam is not projected outside of the housing;
wherein the laser light generator is configured to operate in a second mode in which the first output beam and the second output beam are both projected outside of the housing;
wherein, in the first mode, the first output beam is operated at a first duty cycle and in the second mode the first output beam is operated at a second duty cycle, different than the first duty cycle; and
wherein in the second mode, the first beam output and the second beam output have staggered duty cycles whereby when a pulse of the first beam is high a pulse of the second beam is low and whereby when the pulse of the first beam is low, the pulse of the second beam is high.

2. The laser beam generating device of claim 1, wherein the first output beam is projected as a line and wherein the second output beam is projected as a dot.

3. The laser beam generating device of claim 1, wherein in the second mode at least a portion of the first output beam and the second output beam overlap outside of the housing.

4. The laser beam generating device of claim 1, wherein the first duty cycle is higher than the second duty cycle.

5. The laser beam generating device of claim 4, wherein the first duty cycle is 85% or greater.

6. The laser beam generating device of claim 5, wherein the second duty cycle is 75% or less.

7. The laser beam generating device of claim 1, wherein the first output beam is projected as a line and wherein the second output beam is projected as a dot;
wherein in the second mode at least a portion of the first output beam and the second output beam overlap outside of the housing;
the first duty cycle is higher than the second duty cycle and the first duty cycle is greater than 90%
wherein in the second mode, the second output beam operates at a third duty cycle;
wherein the second duty cycle is less than 80%; and
wherein the third duty cycle is less than 80%.

8. The laser beam generating device of claim 1, wherein the laser light generator comprises a first laser diode which generates the first output beam and a second laser diode which generates the second output beam.

9. A laser beam generating device, comprising:
a housing;
a first laser diode, the first laser diode operable to generate a visible first output beam which projects outside of the housing onto a surface;
a second laser diode, the second laser diode operable to generate a visible second output beam which projects outside of the housing onto the surface;
wherein the laser beam generating device is operable in a first mode wherein the first laser diode is on and a the second laser diode is off such that the visible first output beam is projected outside of the housing and a second mode in which the first laser diode and the second laser diode are both on such that both the visible first output beam and the visible second output beam are projected outside of the housing;
wherein, in the first mode, the first laser diode is operated at a first duty cycle and in the second mode the first laser diode is operated at a second duty cycle, different than the first duty cycle; and
wherein, in the second mode, the second laser diode is operated at a third duty cycle, wherein the second duty cycle and the third duty cycle are staggered.

10. The laser beam generating device of claim 9, wherein the first duty cycle is higher than the second duty cycle.

11. The laser beam generating device of claim 10, wherein the first duty cycle is at least 15 percentage points higher than the second duty cycle.

12. The laser beam generating device of claim 10, wherein the first duty cycle is at least 25 percentage points higher than the second duty cycle.

13. The laser beam generating device of claim 10, wherein the first visible output beam produces a line and wherein the second visible output beam produces a dot; and
wherein the dot intersects with the line.

14. The laser beam generating device of claim 9, wherein, in the second mode, the second laser diode is operated at a third duty cycle, wherein the second duty cycle and the third duty cycle have the same phase.

15. The laser beam generating device of claim 9, further comprising a third mode in which the first laser diode and the second laser diode are both on such that both the visible first output beam and the visible second output beam are projected outside of the housing; and
wherein the first laser diode is operated at a first frequency in the second mode and wherein the first laser diode is operated in a second frequency in the third mode;
wherein the second frequency is at least 20% different than the first frequency.

* * * * *